United States Patent
Pasqualini

(10) Patent No.: US 7,109,747 B1
(45) Date of Patent: Sep. 19, 2006

(54) LOW POWER, HIGH SPEED LOGIC CONTROLLER THAT IMPLEMENTS THERMOMETER-TYPE CONTROL LOGIC BY UTILIZING SCAN FLIP-FLOPS AND A GATED CLOCK

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 110 days.

(21) Appl. No.: 10/938,991

(22) Filed: Sep. 9, 2004

(51) Int. Cl.
- *H03K 19/173* (2006.01)
- *H03K 19/0175* (2006.01)
- *G06F 7/38* (2006.01)
- *H01L 25/00* (2006.01)

(52) U.S. Cl. .............. 326/38; 326/37; 326/41; 326/46; 326/87

(58) Field of Classification Search .............. None
See application file for complete search history.

(56) References Cited

U.S. PATENT DOCUMENTS

| | | | | |
|---|---|---|---|---|
| 5,623,223 A | * | 4/1997 | Pasqualini | 327/298 |
| 5,717,700 A | * | 2/1998 | Crouch et al. | 714/726 |
| 5,867,409 A | * | 2/1999 | Nozuyama | 708/252 |
| 5,881,067 A | * | 3/1999 | Narayanan et al. | 714/726 |
| 6,055,587 A | * | 4/2000 | Asami et al. | 710/49 |
| 6,055,588 A | * | 4/2000 | Steinmetz et al. | 710/52 |
| 6,060,907 A | * | 5/2000 | Vishwanthaiah et al. | 326/87 |
| 6,424,690 B1 | * | 7/2002 | Kay et al. | 375/377 |
| 6,437,589 B1 | * | 8/2002 | Sugano | 324/763 |

OTHER PUBLICATIONS

U.S. Appl. No. 10/818,673, filed May 19, 2005, Pasqualini.

* cited by examiner

*Primary Examiner*—Rexford Barnie
*Assistant Examiner*—Dylan White
(74) *Attorney, Agent, or Firm*—Mark C. Pickering

(57) ABSTRACT

The power dissipation, logic complexity and chip area of a thermometer controller are all significantly reduced by utilizing a series of scan flip-flops that are connected together to form a bi-directional shift register, along with a gated clock signal that clocks the series of scan flip-flops.

22 Claims, 10 Drawing Sheets

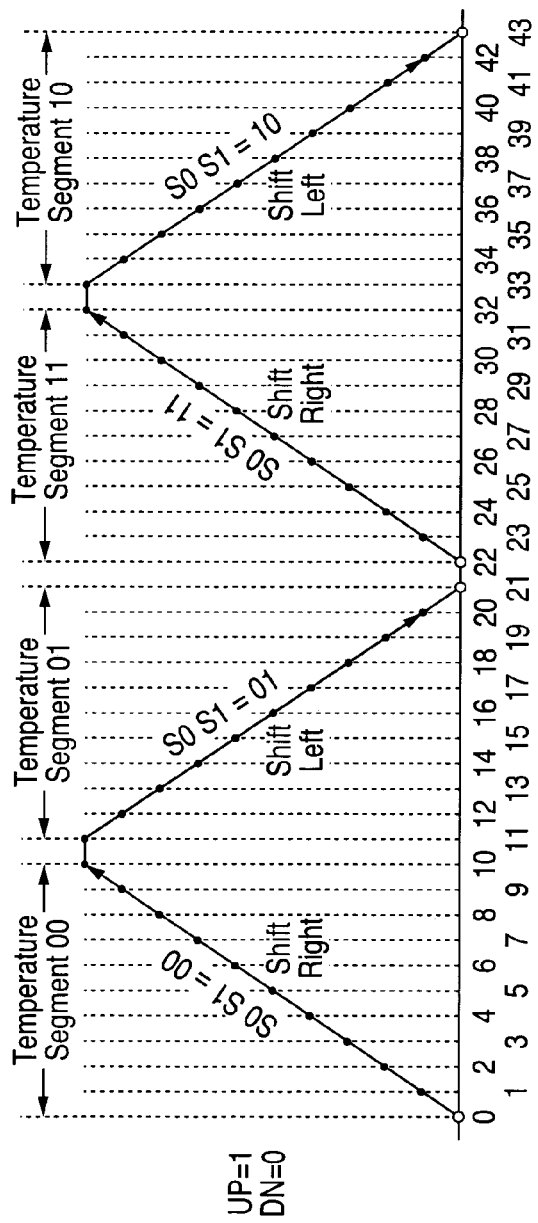
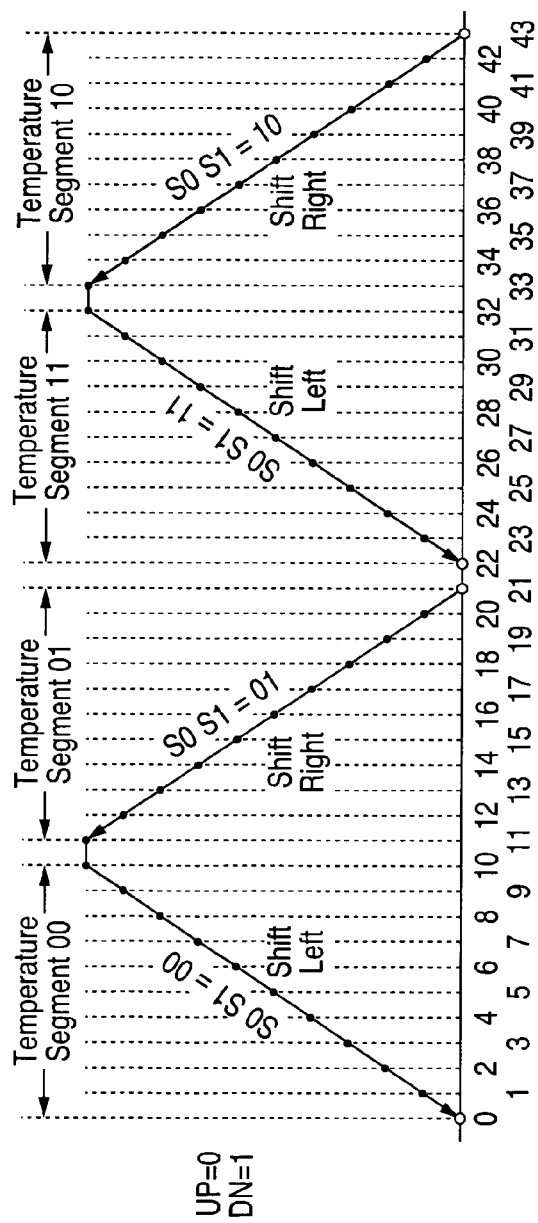
FIG. 8
FIG. 9

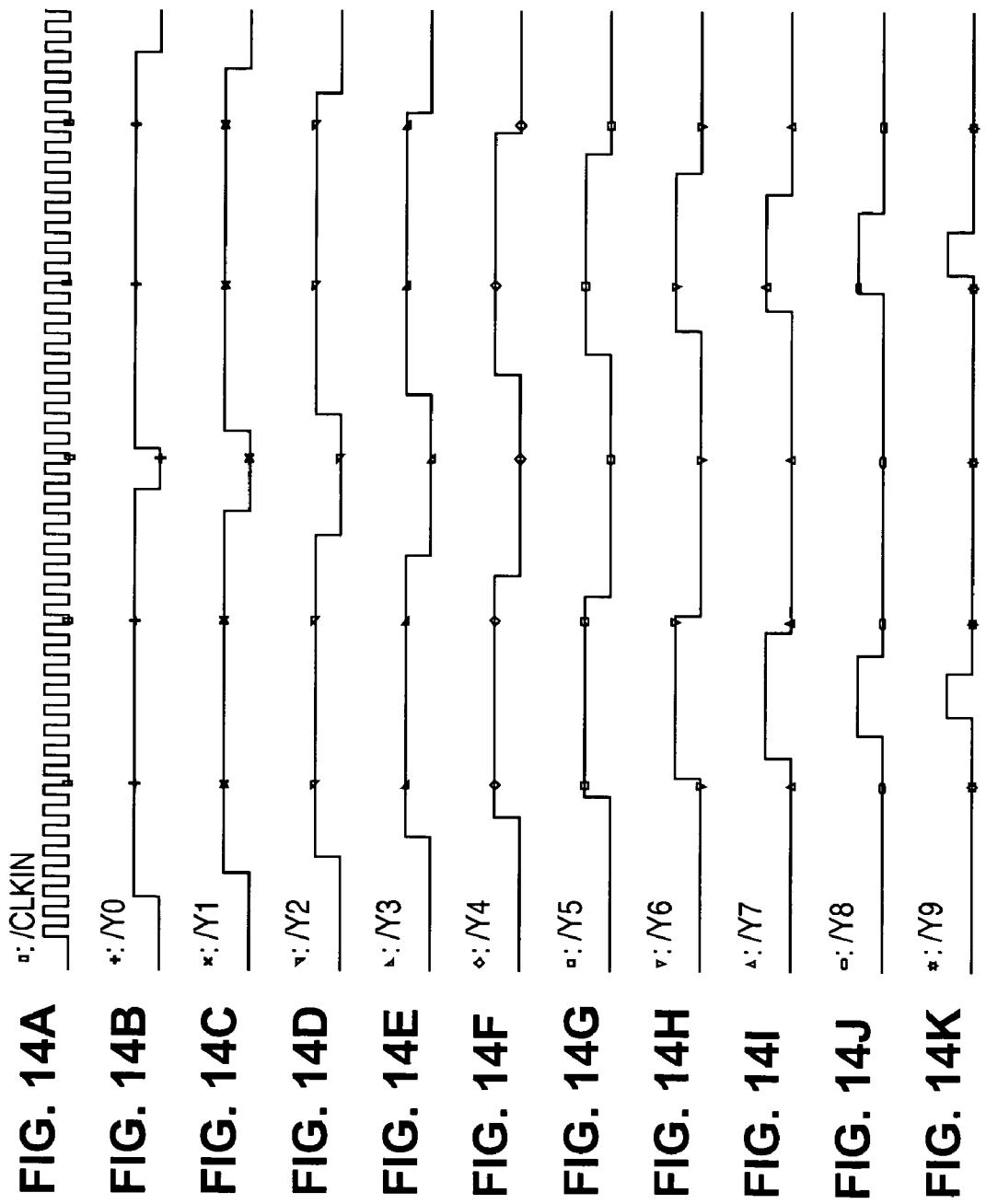

LOW POWER, HIGH SPEED LOGIC CONTROLLER THAT IMPLEMENTS THERMOMETER-TYPE CONTROL LOGIC BY UTILIZING SCAN FLIP-FLOPS AND A GATED CLOCK

BACKGROUND OF THE INVENTION

1. Field of the Invention

The present invention relates to a logic controller and, more particularly, to a low power, high speed logic controller that implements thermometer-type control logic by utilizing scan flip-flops and a gated clock.

2. Description of the Related Art

A logic controller is a device that generates a number of output signals which, in turn, are used to control a number of external logic devices. A logic controller that implements "thermometer type" control logic can be used to generate output signals that monotonically increase or decrease, just like the temperature on a mercury thermometer. As a result of this behavior, this type of logic controller is often referred to as a "thermometer controller."

The output signals of a thermometer controller represent the bits of a thermometer code. The output signals/bits include a first number of output signals/bits that have a first logic state, such as a logic high, followed by a second number of output signals/bits that have a second logic state, such as a logic low (e.g., four thermometer bits, Y0–Y3, could have the logic state 1100).

Thus, taken together, the output signals/bits behave like the temperature indication on a mercury thermometer, where increasing the value of the code is representative of the temperature rising, and decreasing the value of the code is representative of the temperature falling. In addition, the highest output signal/bit that is active, including all of the lower output signals/bits (which must also be active), is representative of the current temperature.

During normal operation, when a thermometer code increases, only one output signal/bit changes state from low to high. The output signal/bit that changes state is the logic zero in the code that lies adjacent to a logic one (e.g., from state 1100 to state 1110).

Similarly, when a thermometer code decreases, only one output signal/bit changes state from high to low. The output signal/bit that changes state is the logic one in the code that lies adjacent to a logic zero, (e.g., from state 1100 to state 1000).

One of the benefits of a thermometer controller is that its output signals/bits are gray coded. As a result, the output signals/bits cannot produce any glitches when they are decoded by external logic gates. This feature is especially important in control applications that attempt to establish and maintain an optimal "set point" within a range of output values. These control applications often attempt to generate a new output value by interpolating between two or more values within the output range.

FIG. 1 shows a block diagram that illustrates a prior-art thermometer controller 100. Referring to FIG. 1, controller 100 receives four control signals and generates eight output signals/bits Y0–Y7 in response. The four control signals include a clock signal CLK, an up signal UP, a down signal DWN and a clear signal CLR. The clear signal CLR resets each of the output signals/bits Y0–Y7 to the logic low state, which is the inactive state for these signals.

To increase the value of the thermometer code, the up signal UP must be active during a given clock cycle. For example, assuming that the output signals Y0–Y3 are initially active in a given clock cycle, and the up signal UP is also active, the output signals Y0–Y3 will remain active in the next clock cycle, and the next highest output signal Y4 will also become active in the next clock cycle (e.g., state 11110000 goes to state 11111000).

To decrease the value of the thermometer code, the down signal DWN must be active during a given clock cycle. For example, assuming that the output signals Y0–Y6 are initially active in a given clock cycle, and the down signal DWN is also active, the output signals Y0–Y5 will remain active in the next clock cycle, but the highest active output signal Y6 will become inactive in the next clock cycle (e.g., state 11111110 goes to state 11111100).

Alternatively, if the up and down signals UP and DWN are both inactive during a given clock cycle, the thermometer code will remain the same in the next clock cycle. For example, if the output signals Y0–Y4 are active in a given clock cycle, and the up and down signals UP and DWN are both inactive in that clock cycle, then the output signals Y0–Y7 will remain unchanged in the next clock cycle (e.g., state 11111000 goes to state 11111000).

One drawback of controller 100 is that it can only generate nine different temperature codes (including the case where all of the output signals are inactive). One approach to overcoming this limitation is to employ a code segmentation approach.

FIG. 2 shows the block diagram of a prior-art thermometer controller 200. Controller 200 is the same as controller 100, except that controller 200 also generates S0 and S1, two additional temperature output signals/bits. S0 and S1 represent four encoded temperature ranges that are usually referred to as temperature "segments".

Temperature segment signals/bits S0 and S1 extend the temperature range of controller 200 by adding only a minimum number of additional outputs. For example, controller 200 has four temperature segments represented by the Gray-coded temperature segment signals/bits S0 and S1. The additional S0 and S1 bits allow controller 200 to output the equivalent of 36 different temperature values, as follows:

| Temperature Segment | S1 | S0 | Y0–Y7 |
|---|---|---|---|
| 0 | 0 | 0 | 00000000 . . . 11111111 (9 temperatures) |
| 1 | 0 | 1 | 00000000 . . . 11111111 (9 temperatures) |
| 2 | 1 | 1 | 00000000 . . . 11111111 (9 temperatures) |
| 3 | 1 | 0 | 00000000 . . . 11111111 (9 temperatures) |

When there are only four encoded temperature segments, the segment outputs are usually referred to as temperature "quadrant" outputs, corresponding to the four quadrants of a circle (0°–90°, 90°–180°, 180°–270° and 270°–360°). Since the temperature segment/quadrant signals are Gray coded, the temperature segment/quadrant signals can be decoded by external logic gates without producing any output "glitches." This is very important in many control applications, especially those related to switching DAC outputs.

FIG. 3 shows the block diagram of a prior-art thermometer controller 300. Referring to FIG. 3, controller 300 has a series of output circuits CT0–CTn that generate a series of output signals Y0–Yn. Output signals Y0–Yn represent a series of bits in a thermometer code (only five output signals/bits Y0–Y4 are shown for the sake of clarity).

As further shown in FIG. 3, the output circuits CT0–CTn include a series of flip-flops U0–Un (only five flip-flops U0–U4 are shown for the sake of clarity), and a corresponding series of multiplexers M0–Mn (only five multiplexers M0–M4 are shown for the sake of clarity). Each flip-flop U0–Un, in turn, has a Q output, a data input D, a clock input connected to receive a clock signal CLK, and a clear input connected to receive a clear signal CLR.

Each multiplexer M0–Mn has three data inputs, an up input connected to receive an up signal UP, a down input connected to receive a down signal DWN, and an output connected to the D input of the flip-flop in the same output circuit. Furthermore, the three data inputs of each multiplexer M0–Mn include a first input that is connected to the Q output of flip-flop in the same output circuit, a second input that is connected to the Q output of the flip-flop in the preceding output circuit, and a third input connected to Q output of the flip-flop in the next output circuit.

For example, the first input of multiplexer M2 of output circuit CT2 is connected to the Q output of flip-flop U2. The second input of multiplexer M2 of output circuit CT2 is connected to the Q output of flip-flop U1. The third input of multiplexer U2 of output circuit CT2 is connected to the Q output of flip-flop U3. During any given clock cycle, only one of the 3 multiplexer input signals is passed to the output of the multiplexer, according to the state of the UP/DWN signals.

For example, the three input sources to multiplexer M2 are selected as follows:

| UP | DWN | Selected Input Source | Comment |
| --- | --- | --- | --- |
| 0 | 0 | Q output of U2 (Y2) | Temperature does not change |
| 0 | 1 | Q output of U3 (Y3) | Temperature decreases by one count |
| 1 | 0 | Q output of U1 (Y1) | Temperature increases by one count |
| 1 | 1 | None | Illegal input selection (not allowed) |

Referring to the above table and to FIG. 3, it can be seen that the flip-flops U0–U4 of output circuits CT0–CT4 form a 5-bit bi-directional shift register that can implement one of the following three operations in any given clock period, depending upon the state of the up and down signals UP and DWN:

| 1) | UP = 0, DWN = 0: | Hold the present state, |
| --- | --- | --- |
| 2) | UP = 1, DWN = 0: | Shift right by one bit, and |
| 3) | UP = 0, DWN = 1: | Shift left by one bit. |

During normal operation, when the clear signal CLR is activated, the output signals Y0–Yn (Y0–Y4 in FIG. 3) are inactivated to their cleared state. This sets the thermometer code to zero.

The value of the thermometer code is increased by performing a right shift operation in response to the up signal UP. Thus, when the up signal UP is active, the multiplexers M1–Mn in the output circuits CT1–Crn pass the logic states of the Q outputs of the flip-flops U0–Un−1 in the preceding output circuits CT0–CTn−1, while the multiplexer M0 in output circuit CT0 passes a logic high represented by the power supply voltage VDD.

For example, consider the case where the output signals/bits Y0–Y3 are active and the output signal/bit Y4 is inactive. When the up signal UP is active, the multiplexer M0 of output circuit CT0 passes the active state generated by the power supply voltage VDD, the multiplexer M1 of output circuit CT1 passes the active state generated by the Q output of flip-flop U0 of output circuit CT0, and the multiplexer M2 of output circuit CT2 passes the active state generated by the Q output of flip-flop U1 of output circuit CT1.

Furthermore, the multiplexer M3 of output circuit CT3 passes the active state generated by the Q output of flip-flop U2 of output circuit CT2, and the multiplexer M4 of output circuit CT4 passes the active state generated by the Q output of flip-flop U3 of output circuit CT3. As a result, on the next clock edge, the output signal Y4 of output circuit CT4 becomes active, thereby increasing the value of the thermometer code from state 11110 to state 11111.

The value of the thermometer code is decreased by performing a left shift operation in response to the down signal DWN. When the down signal DWN is active, the multiplexers M0÷Mn−1 in the output circuits CT0–CTn−1 pass the logic states of the Q outputs of the flip-flops U1–Un of the next output circuits CT1–CTn, while the multiplexer M4 in output circuit CT4 passes a logic low represented by ground VSS.

For example, consider the case where the output signals/bits Y0–Y3 are active and the output signal/bit Y4 is inactive. When the down signal DWN is active, the multiplexer M0 of output circuit CT0 passes the active state generated by the Q output of flip-flop U1 of output circuit CT1, the multiplexer M1 of output circuit CT1 passes the active state generated by Q output of flip-flop U2 of output circuit CT2, and the multiplexer M2 of output circuit CT2 passes the active state generated by Q output of flip-flop U3 of output circuit CT3.

Furthermore, the multiplexer M3 of output circuit CT3 passes the inactive state generated by Q output of flip-flop U4 of output circuit CT4, and the multiplexer M4 of output circuit CT4 passes the inactive state represented by ground VSS. As a result, on the next clock edge, the output signal Y3 of output circuit CT3 becomes inactive, thereby decreasing the value of the thermometer code from 11110 to 11100.

Furthermore, if the up and down signals UP and DWN are both inactive during a given clock cycle, the thermometer code will remain the same in the next clock cycle. Thus, when the up and down signals UP and DWN are both inactive, the multiplexers M0–Mn in the output circuits CT0–CTn pass the logic states of the Q outputs of the flip-flops U0–Un, respectively.

For example, consider the case where output signals Y0–Y3 are active and the output signal Y4 is inactive. When the up and down signals UP and DWN are both inactive, the multiplexers M0–M4 of output circuits CT0–CT4 pass the states generated by the output circuits CT0–CT4, respectively.

Logic controller 300 suffers from several disadvantages, including high power dissipation, high complexity and large chip area. The high power dissipation occurs because the clock signal CLK must constantly run and can not be stopped. Thus, because the clock signal CLK must drive all of the flip-flops U0–Un shown in FIG. 3, the clock signal CLK must constantly drive a large capacitance C.

This, in turn, results in high dynamic power dissipation, known as $CV^2F$ power, where C is the load capacitance being driven, V is the power supply voltage VDD, and F is the clock frequency. High dynamic power dissipation is especially disadvantageous in high-speed applications, where the clock frequency can be in the giga-hertz region.

Another disadvantage of logic controller 300 is the use of a three-input multiplexer that requires a large number of gates, adding additional complexity, additional power dissipation and additional chip area. FIGS. 4A–4B illustrate a prior-art, 3-input multiplexer 400. FIG. 4A shows a symbolic view, while FIG. 4B shows a schematic view.

As shown in FIGS. 4A–4B, multiplexer 400 generates an output signal OUT, while receiving an up signal UP, a down signal DWN, and three inputs A1, A2, A3. Furthermore, multiplexer 400 is implemented with a complex gate 410, which includes three AND gates and a NOR gate, plus three inverters 412, 414, and 416.

As a result of the disadvantages described above, there is a need for a more efficient thermometer controller.

BRIEF DESCRIPTION OF THE DRAWINGS

FIG. 4A is a symbolic view; FIG. 4B is a schematic view.

FIG. 8 is a graph illustrating an example of the operation of segmented thermometer controller 700 in accordance with the present invention.

FIG. 9 is a graph illustrating an example of the operation of segmented thermometer controller 700 in accordance with the present invention.

FIGS. 14A–14K are timing diagrams illustrating an example of the temperature waveforms of the output signals/bits Y0–Y9 in accordance with the present invention.

DETAILED DESCRIPTION OF THE INVENTION

Figure 5:
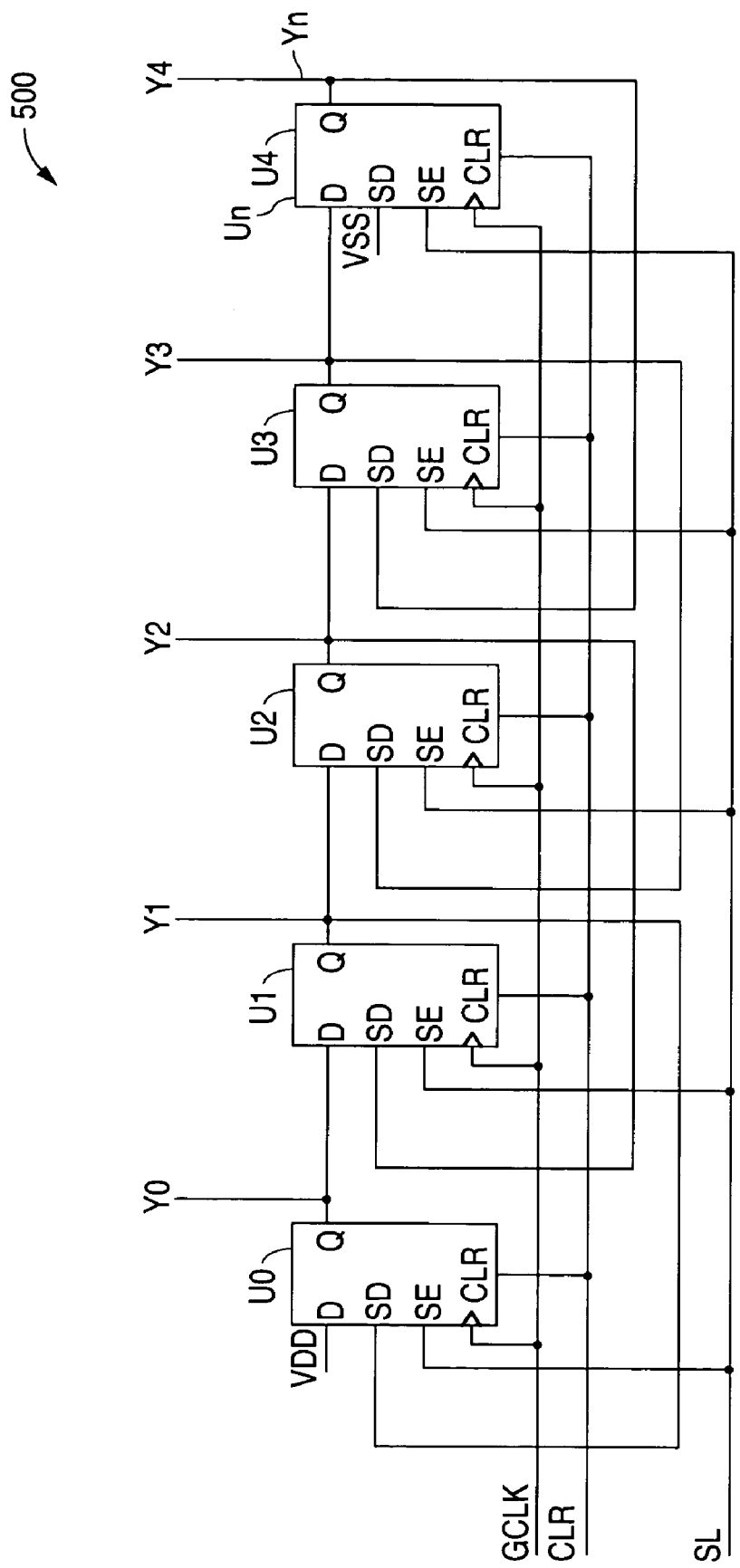
FIG. 5 is a schematic view illustrating an example of a thermometer controller 500 in accordance with the present invention.

FIG. 5 shows the schematic view of a thermometer controller 500 that is in accordance with the present invention. As described in greater detail below, controller 500, which functions as a bidirectional shift register, significantly reduces power dissipation, logic complexity, and chip area. This is accomplished by utilizing a series of scan flip-flops in conjunction with a gated clock signal.

As shown in FIG. 5, controller 500 contains a series of scan flip-flops U0–Un that generate a series of output signals Y0–Yn. Output signals Y0–Yn represent a series of bits in a thermometer code (only five output signals/bits Y0–Y4 are shown for the sake of clarity). Each scan flip-flop U0–Un has an output Q, a data input D, a scan data input SD, a scan enable input SE, a clock input connected to receive a gated clock signal GCLK, and a clear input connected to receive a clear signal CLR. Unlike a system clock that runs continuously, a gated clock signal is a clock signal that is only activated when a specific condition is present.

With the exception of the first scan flip-flop U0, the data input D of each scan flip-flop U1–Un is electrically connected to the Q output of the preceding scan flip-flop in the series. For example, the data input D of scan flip-flop U1 is connected to the Q output of the preceding scan flip-flop U0. The data input D of scan flip-flop U0 is, in turn, connected to a power supply voltage VDD.

Each scan flip-flop U0–Un has a scan enable input SE that receives a shift left/right signal SL and a scan data input SD. Except for the last flip-flop Un, the scan data input SD of each of the flip-flops U0–Un-1 is electrically connected to the Q output of the next scan flip-flop in the series. For example, the scan data input SD of scan flip-flop U1 is electrically connected to the Q output of the next scan flip-flop U2. The scan data input SD of scan flip-flop Un is, in turn, connected to ground VSS.

In operation, when the clear signal CLR is activated, the output signals/bits Y0–Y4 are inactivated, resetting the thermometer code to zero. The value of the thermometer code can be increased by performing a right shift operation in response to the shift left/right signal SL. Thus, when the shift left/right signal SL is inactive, scan flip-flops U1–Un will perform a right shift operation. During a right shift operation, scan flip-flops U1–Un will pass the logic states on the Q outputs of flip-flops U0–Un−1, while scan flip-flop U0 passes a logic high represented by the power supply voltage VDD.

For example, consider the case where output signals/bits Y0–Y3 are active and the output signal/bit Y4 is inactive. When the shift left/right signal SL is inactive, scan flip-flop U0 will pass the active state generated by the power supply voltage VDD, scan flip-flop U1 will pass the active state generated by the Q output of scan flip-flop U0, and scan flip-flop U2 will pass the active state generated by the Q output of scan flip-flop U1.

Furthermore, scan flip-flop U3 will pass the active state generated by the Q output of scan flip-flop U2, and scan flip-flop U4 will pass the active state generated by the Q output of scan flip-flop U3. As a result, on the next rising edge of the gated clock GCLK, the output signal/bit Y4 of scan flip-flop U4 will become active, thereby increasing the value of the thermometer code from 11110 to 11111.

The value of the thermometer code can be decreased by performing a left shift operation in response to the shift left/right signal SL. Thus, when the shift left/right signal SL is active, scan flip-flops U0–Un−1 will perform a left shift operation. During a shift left operation, scan flip-flops U0–Un−1 will pass the logic states on their scan inputs SD, which are connected to the Q outputs of scan flip-flops U1–Un, while scan flip-flop Un (U4) passes a logic low represented by ground VSS.

For example, consider the case where the output signals/bits Y0–Y3 are active and the output signal/bit Y4 is inactive. When the shift left/right signal SL is active, scan flip-flop U0 will pass the active state generated by the Q output of scan flip-flop U1, scan flip-flop U1 will pass the active state generated by the Q output of scan flip-flop U2, and scan flip-flop U2 will pass the active state generated by the Q output of scan flip-flop U3.

Furthermore, scan flip-flop U3 will pass the inactive state generated by the Q output of scan flip-flop U4, and scan flip-flop U4 will pass the inactive state generated by ground VSS. As a result, on the next rising edge of the gated clock GCLK, the output signals/bits Y3 and Y4 of scan flip-flops U3 and U4 will be inactive, thereby decreasing the value of the thermometer code from 11110 to 11100.

The logic state of the shift left/right signal SL only matters when the gated clock signal GCLK rises. Thus, when the gated clock signal GCLK does not rise, the logic state of the shift left/right signal SL is of no consequence and the output signals/bits Y0–Yn (Y4) will not change.

Controller 500 of the present invention provides a number of advantages when compared to prior art controllers, such as controller 300. These advantages include substantially decreasing the dynamic power dissipation and the chip area of the controller, as well as substantially increasing the controller's maximum frequency of operation.

The dynamic power dissipation ($CV_{DD}^2 F_{CLK}$) is substantially decreased because the average frequency of the gated clock signal GCLK is considerably less than the frequency of the non-gated clock signal CLK. This occurs because, in most applications, once the thermometer code reaches the desired set point, it does not have to be changed very often. As a result, the gated clock pulses GCLK occur much less frequently than the non-gated clock pulses CLK (which must always be present).

In addition, the power dissipation is further reduced because the scan flip-flops U0–Un used in controller 500 completely eliminate the need for the standalone 3-input multiplexers M0–Mn needed in prior art controller 300. Thus, in addition to reducing power dissipation, eliminating the multiplexer components also reduces the required chip area.

Figure 6:
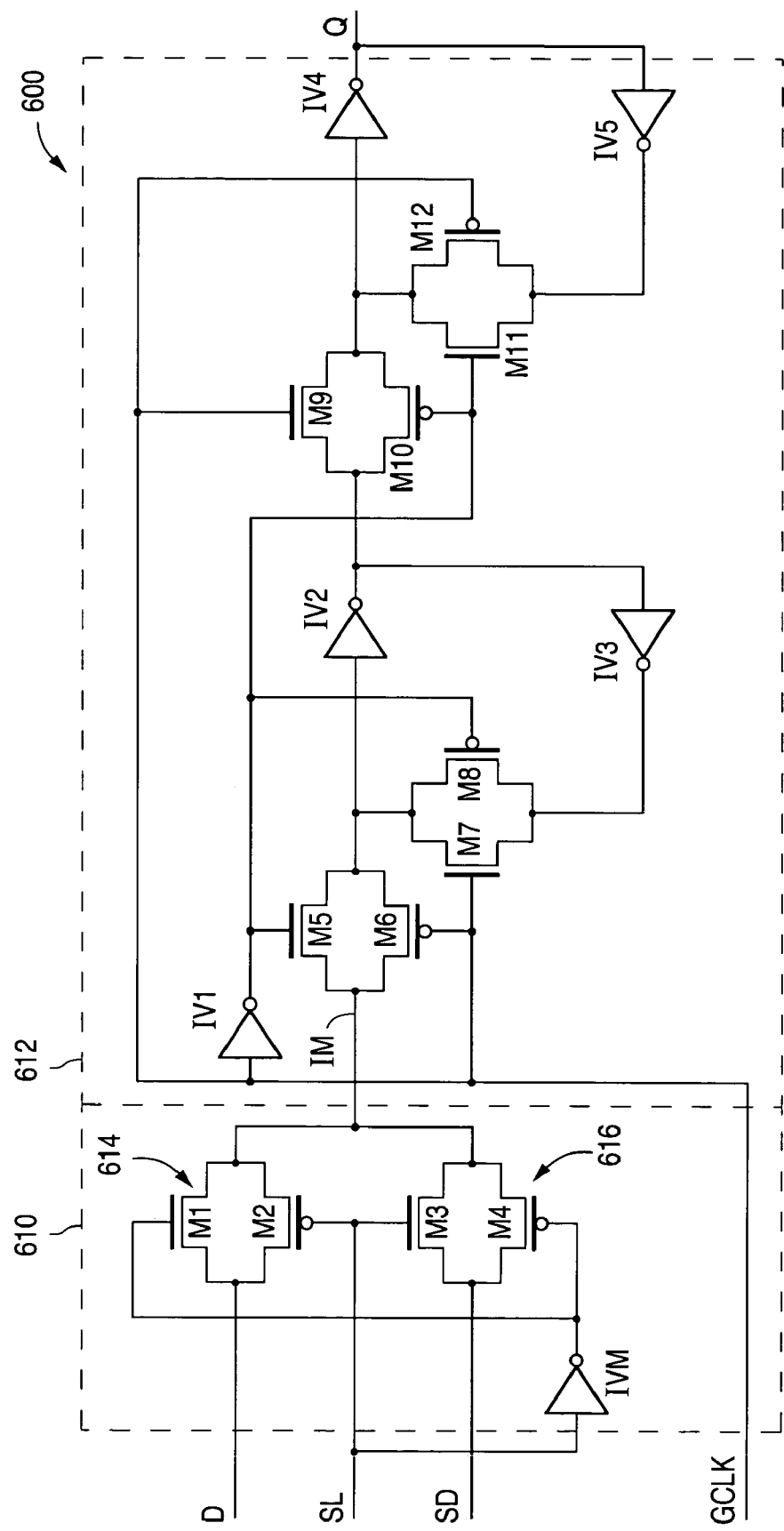
FIG. 6 is a schematic diagram illustrating an example of a scan flip-flop 600 in accordance with the present invention.

FIG. 6 shows a schematic diagram that illustrates an example of a scan flip-flop 600 in accordance with the present invention. As shown in FIG. 6, scan flip-flop 600 is composed of a multiplexer 610 and a flip-flop 612. Multiplexer 610 passes one of two logic signals to flip-flop 612, as an intermediate signal IM. Flip-flop 612 then captures the state of intermediate signal IM on the active (rising) edge of the gated clock signal GCLK.

Referring to FIG. 6, multiplexer 610 includes a first transmission gate 614, which includes transistors M1 and M2. Transistors M1 and M2 pass the logic state on the data input D, as an intermediate signal IM, when they are turned on. Furthermore, multiplexer 610 also includes a second transmission gate 616, which includes transistors M3 and M4. Transistors M3 and M4 pass the logic state on the scan data input SD, as an intermediate signal IM, when they are turned on.

In addition, multiplexer 610 also includes an inverter IVM that inverts the shift left/right signal SL. As a result, transistors M1 and M2 are turned on and transistors M3 and M4 are turned off when the shift left/right signal SL is inactive, indicating a right shift operation. Similarly, transistors M1 and M2 are turned off and transistors M3 and M4 are turned on when the shift left/right signal SL is active, indicating a left shift operation.

Referring to FIG. 6, it can be seen that the four transistors M1–M4 and the two transistors inside of inverter IVM (six transistors total) form a 2:1 multiplexer. In contrast, the 3:1 multiplexer 400 shown in FIG. 4B requires 24 transistors (18 transistors for the complex gate 410, plus 6 transistors for the three inverters 412, 414, and 416). Thus, comparing the 2:1 multiplexer 610 with the 3:1 multiplexer 400, the 2:1 multiplexer 610 has 18 fewer transistors, significantly reducing power dissipation and chip area.

Figure 1:
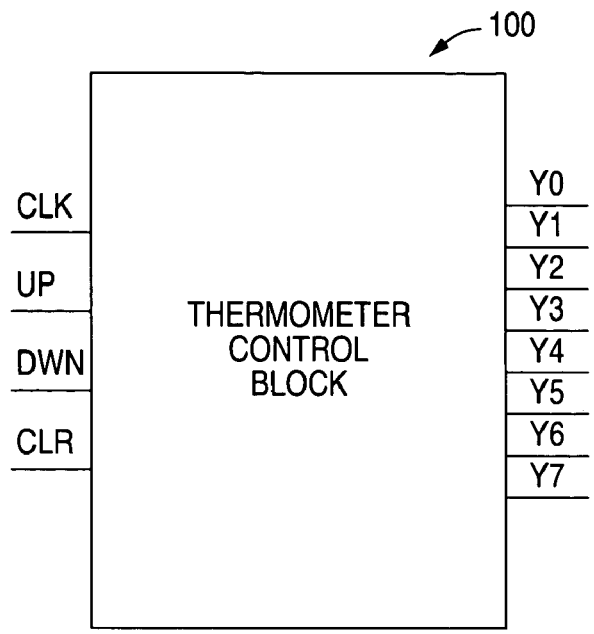
FIG. 1 is a block diagram illustrating a prior-art, thermometer controller 100.
Figure 2:
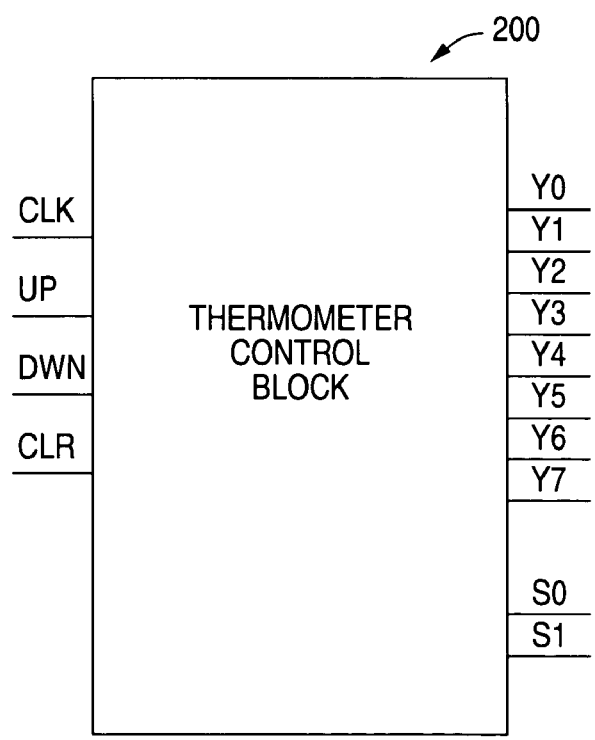
FIG. 2 is a block diagram illustrating a prior-art, thermometer controller 200.
Figure 3:
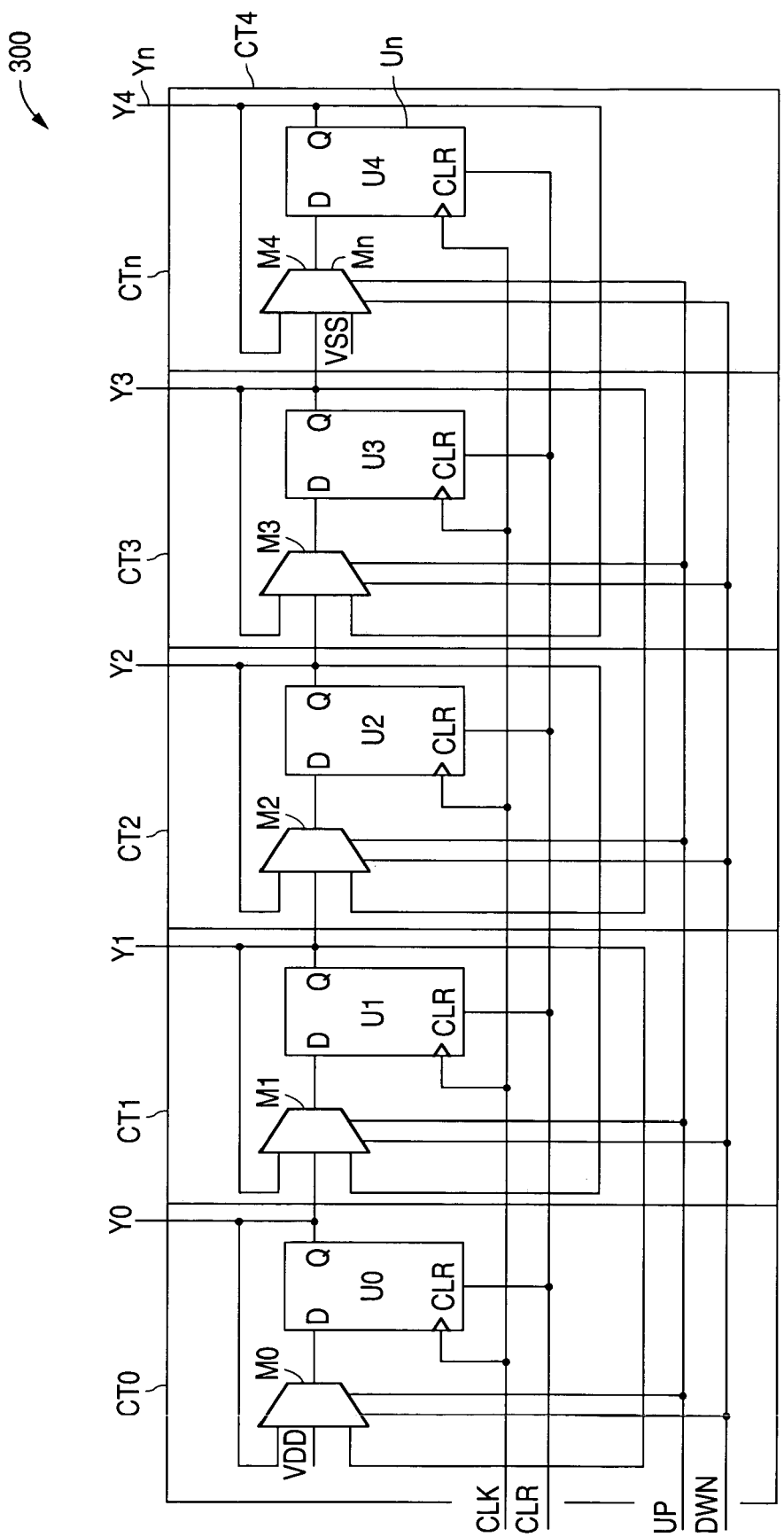
FIG. 3 is a block diagram illustrating a prior-art, thermometer controller 300.
Figure 4A:
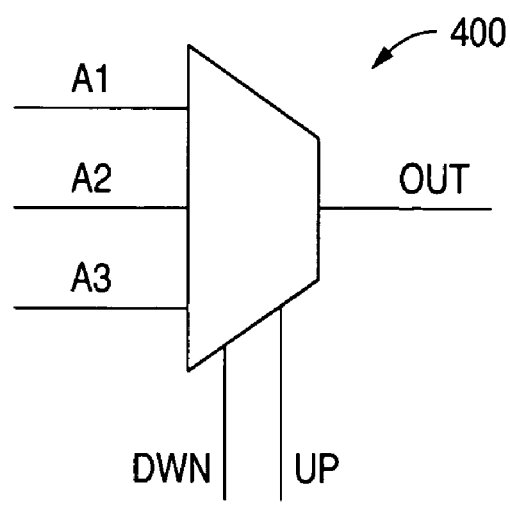
FIGS. 4A–4B are views illustrating a prior-art, 3-input multiplexer 400.
Figure 4B:
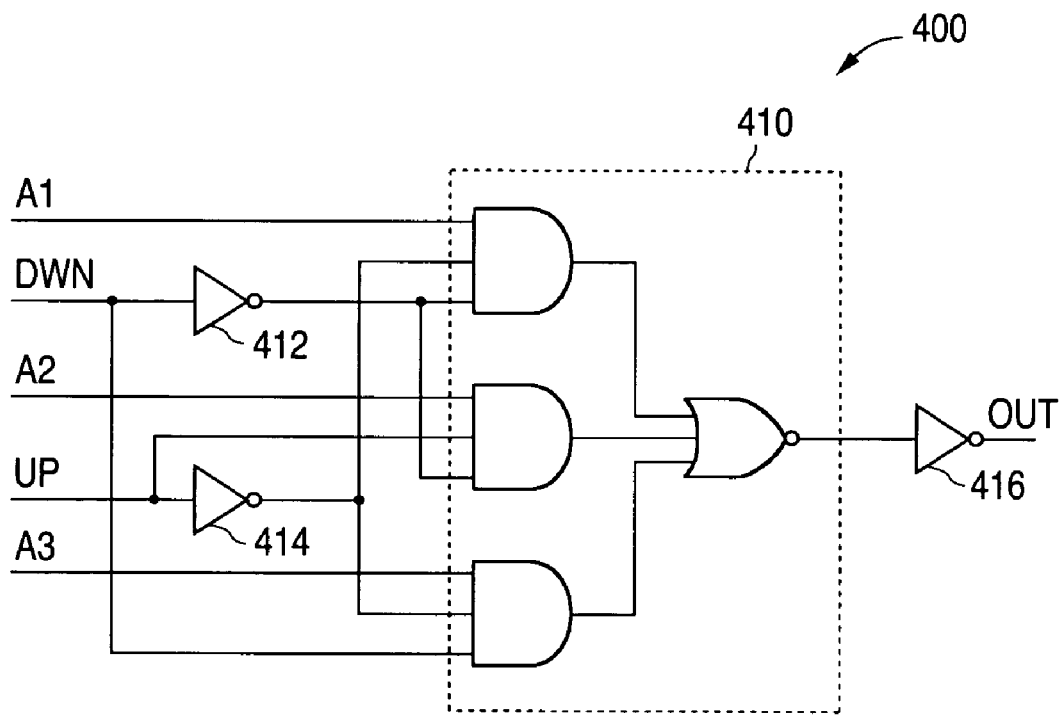

Referring to FIG. 4B, each of the multiplexed data input signals A1, A2, A3 must drive the gate terminal of one p-channel transistor and one n-channel transistor inside of complex gate 410. Since these p-channel/n-channel transistors are stacked 3 high, their widths must be made large, significantly increasing their capacitance and, in turn, their power dissipation. In contrast, the multiplexed data signals D and SD in FIG. 6 do not drive any high capacitance gate terminals inside of multiplexer 610. Thus only low capacitance source/drain terminals are being driven, significantly decreasing the power dissipation of multiplexer 610.

Referring to FIG. 6, it can be seen that multiplexer 610 does not dissipate any power when the two data inputs D and SD change state. Thus power dissipation only occurs when the shift left/right signal SL changes state, which does not occur very often in most applications.

In contrast, 3:1 multiplexer 400 dissipates power when one or more of the three data inputs (A1, A2, A3) change state, and when the UP and DWN input signals change state. As a result, the power dissipation of the 2:1 multiplexer 610 is even further reduced in comparison to the 3:1 multiplexer 400.

In comparison to the 3:1 multiplexer 400, the 2:1 multiplexer 610 has another significant advantage: a much faster operating speed. The reason is that, as shown in FIG. 6, a signal on the data input D or the scan data input SD must only propagate through the non-inverting transistors M1/M2 (which are connected in parallel), or the non-inverting transistors M3/M4 (which are also connected in parallel).

In comparison, the 3:1 multiplexer 400 shown in FIG. 4B requires that input signals on the A1, A2 and A3 inputs must propagate through two inverting levels of logic (complex gate 410 and inverter 416). This propagation delay is considerably slower than the propagation delay through the non-inverting transistors M1/M2 and M3/M4 shown in FIG. 6.

In light of the above comparisons, those skilled in the state of the art will appreciate that the 2:1 multiplexer 610 shown in FIG. 6 is significantly superior to the 3:1 multiplexer 400 shown in FIG. 4B with respect to power dissipation, chip area and speed of operation.

Figure 7:
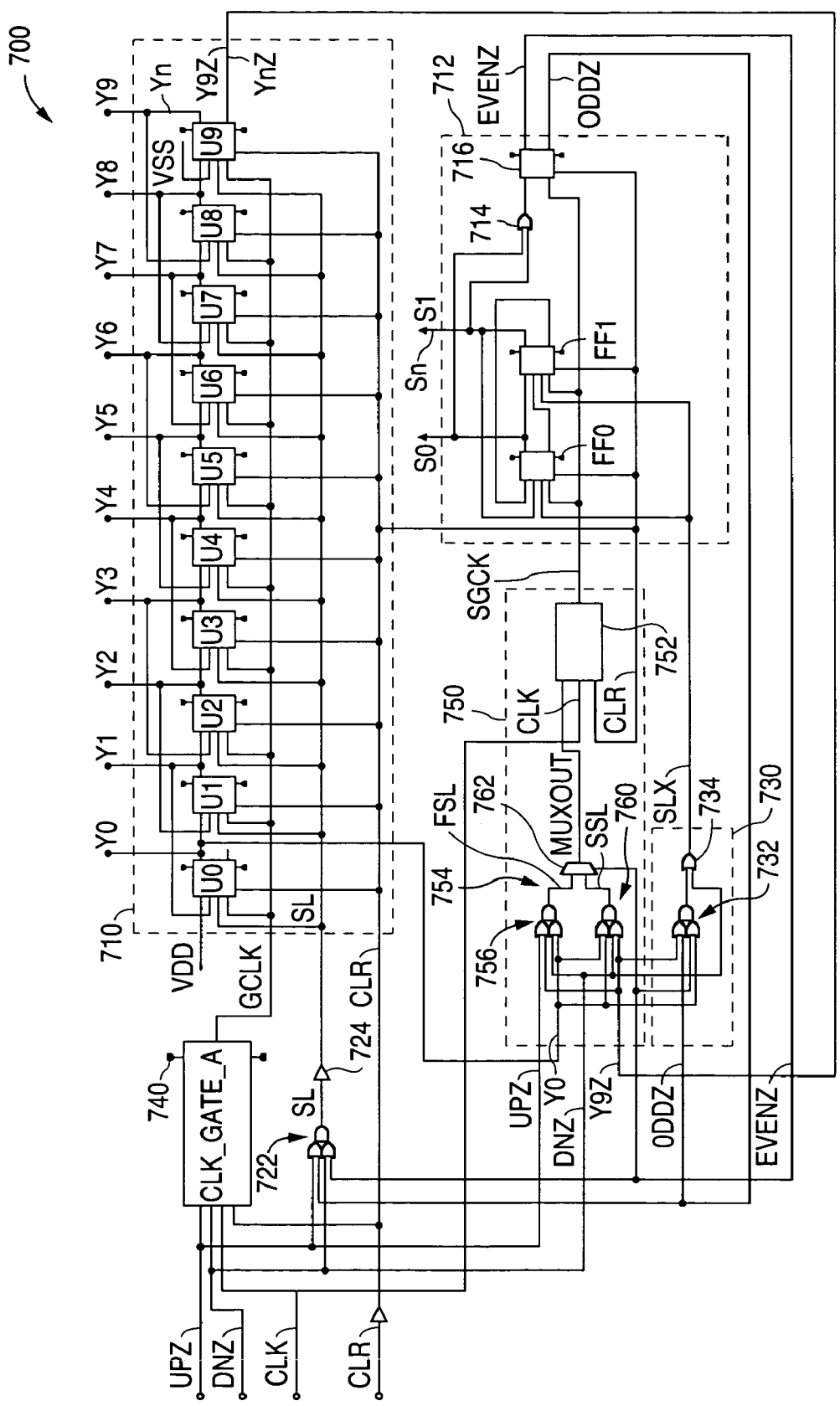
FIG. 7 is a schematic view illustrating an example of a segmented thermometer controller 700 in accordance with the present invention.

FIG. 7 shows a schematic view that illustrates an example of a segmented thermometer controller 700 in accordance with the present invention. As shown in FIG. 7, segmented thermometer controller 700 includes a segment controller 710 that generates a series of output signals Y0–Yn that represent a series of bits in a thermometer code. Controller 710 is identical to controller 500, except that the controller 710 example shows 10 scan flip-flops U0–U9 along with the inverse of the highest output signal YnZ.

Referring to FIG. 7, segmented thermometer controller 700 also includes an output stage 712 that generates a series of temperature segment signals/bits S0–Sn (two bits S0 and S1 are shown in the FIG. 7 example). Furthermore, output stage 712 also generates an active low even signal/bit EVENZ and an active low odd signal/bit ODDZ. All four of these output signals/bits are generated in response to a segment gated clock input signal/bit SGCK and a shift left/right input signal/bit SLX.

As shown in the FIG. 7 example, output stage 712 includes a pair of scan flip-flops FF0 and FF1 that generate the segment signals/bits S0 and S1. Output stage 712 also includes an exclusive NOR gate 714 and a D flip-flop 716.

Exclusive NOR gate 714 outputs a logic high when the segment signals/bits S0 and S1 are even (0,0 or 1,1), and a logic low when the segment signals/bits S0 and S1 are odd (0,1 or 1,0). Flip-flop 716, which has a D input, a Q output and a QZ output, receives the output of XNOR gate 714 on its D input, and outputs this value on its Q output and its inverse QZ output. The Q and QZ output signals can only change state on the active (rising) edge of the segment gated clock signal SGCK.

In addition, segmented thermometer controller 700 also includes a complex gate 722 that generates a shift left/right signal/bit SL, and a non-inverting buffer 724 that buffers the shift left/right signal/bit SL. Complex gate 722 generates the shift left/right signal/bit SL as follows:

$$SL = UP*ODD + DN*EVEN \qquad \text{EQ. 1}$$

where UP represents an up signal, ODD represents an odd signal, DN represents a down signal, and EVEN represents an even signal. Since the S0 and S1 signals in FIG. 7 must be odd or even, the ODD signal is logically equivalent to EVENZ, the logical complement of the EVEN signal. Similarly, the EVEN signal is logically equivalent to ODDZ, the logical complement of the ODD signal.

In other words, segment controller 710 will shift the output signals/bits Y0–Y9 left if the up signal UP is high (input UPZ=0) and the segment signals/bits S0 and S1 are odd (ODD=1), or if the down signal DN is high (input DNZ=0) and the segment signals/bits S0 and S1 are even (EVEN=1).

Referring to FIG. 7, segmented thermometer controller 700 also includes a shift circuit 730 that is composed of complex gate 732 and NOR gate 734. Shift circuit 730 generates a shift left/right signal/bit SLX as follows:

$$SLX = (ODD*Y9 + EVEN*Y0Z)*DN \qquad \text{EQ. 2}$$

In other words, output circuit 712 will shift the segment signals/bits S0–S1 left if the down signal DN is high (DNZ=0), and the segment signals/bits S0 and S1 are odd (ODD=1), and the most significant output signal/bit Y9 is high; or if the down signal DN is high (DNZ=0), and the segment signals/bits S0 and S1 are even (EVEN=1), and the least significant output signal/bit Y0 is low.

Referring to FIG. 7, segmented thermometer controller 700 also includes a gated clock circuit 740 that outputs a gated clock signal GCLK in response to the following input signals: an active low up signal UPZ, an active low down signal DNZ, a clock signal CLK and a clear signal CLR. When the CLR signal is active, it resets all of the flip-flops in segmented thermometer controller 700. Since the clock signal CLK must continuously run and is not gated, it can be generated from the periodic system clock.

Segmented thermometer controller 700 further includes a gated clock circuit 750 that outputs a segment gated clock signal SGCK. Gated clock circuit 750 includes a clock gating circuit 752 and a switch circuit 754. Clock gating circuit 752 receives three input signals: the clock signal CLK, the clear signal CLR and a mux signal MUXOUT. Clock gating circuit 752 also outputs the segment gated clock signal SGCK.

The mux signal MUXOUT is generated by switch circuit 754, which includes a first complex gate 756 that outputs a first signal FSL in response to the active low up signal UPZ, the inverse of the last output signal/bit Y9Z, the active low down signal DNZ, and the first output signal/bit Y0.

Furthermore, switch circuit 754 also includes a second complex gate 760 that outputs a second signal SSL in response to the active low up signal UPZ, the first output signal/bit Y0, the active low down signal DNZ, and the inverse of the last output signal/bit Y9Z. Switch circuit 754 also includes a 2:1 multiplexer 762 that passes the first signal FSL or the second signal SSL as the mux out signal MUXOUT, depending upon the logic state of the active low input signal EVENZ.

The logic equation for the mux out signal MUXOUT can be written as:

$$MUXOUT = EVEN*(UP*Y9 + DWN*Y0Z) + EVENZ* (UP*Y0Z + DWN*Y9). \qquad \text{EQ. 3}$$

As shown in FIG. 7, the active low even signal EVENZ and the active low odd signal ODDZ are logical complements of each other because they are generated by the Q and QZ outputs of flip-flop 716. Similarly, the active high even and odd signals EVEN and ODD are also logical complements of each other. Thus, equation EQ.3 can be rewritten as:

$$MUXOUT = EVEN*(UP*Y9 + DWN*Y0Z) + ODD* (UP*Y0Z + DWN*Y9). \qquad \text{EQ. 4}$$

Clock gating circuit 752 samples the MUXOUT signal on the falling edge of the clock signal CLK. Thus, if the MUXOUT signal is low when the clock signal CLK falls, clock gating circuit 752 will not generate a gated clock pulse on the next rising edge of the clock signal CLK. As a result, flip-flops FF0–FF1 will not change state and the segment signals/bits S0 and S1 will remain unchanged.

Alternatively, if the MUXOUT signal is high when the clock signal CLK falls, clock gating circuit 752 will generate a gated clock pulse on the next rising edge of the clock signal CLK. As a result, flip-flops FF0–FF1 will change state, causing the segment signals/bits S0 and S1 to change state.

In accordance with the present invention, FIG. 8 shows an example of the operation of segmented thermometer controller 700 for the case where the up signal UP is continually active (UPZ=0) and the down signal DN is continually inactive (DNZ=1).

Referring to FIG. 8, temperature segment 00 is activated when segment signals/bits S0–S1 are both low, temperature segment 01 is activated when segment signal/bit S0 is low and segment signal/bit S1 is high, temperature segment 11 is activated when segment signals/bits S0–S1 are both high, and temperature segment 10 is activated when segment signal/bit S0 is high and segment signal/bit S1 is low. Because the up signal UP is continually active (UPZ=0), temperature segment changes will occur in the following order, and then repeat in the same sequence: 00, 01, 11, 10.

Referring to FIG. 8, a count of zero occurs in temperature segment 00 when all of the output signals/bits Y0–Y9 are inactive. In addition, a count of 1 occurs in temperature segment 00 when only the lowest output signal/bit Y0 is active, while a count of 2 occurs in temperature segment 00 when the two lowest output signals/bits Y0 and Y1 are both active. Similarly, a count of 9 occurs in temperature segment 00 when the output signals/bits Y0–Y8 are active, while a count of 10 occurs in temperature segment 00 when all of the output signals/bits Y0–Y9 are active.

However, when reaching the count of 10, the output signal/bit Y9Z changes state from a logic high to a logic low. When the output signal/bit Y9Z changes state, the temperature segment signal/bit S1 also changes state from a logic low to a logic high, while temperature segment signal/bit S0 remains at a logic low. Thus, as shown in FIG. 8, this causes the temperature segment to change from 00 to 01.

This, in turn, changes the logic states of the even and odd signals EVENZ and ODDZ that are output by flip-flop 716. When the even and odd signals EVENZ and ODDZ change state, complex gate 722 changes the logic state of the shift left/right signal SL that controls the shift direction of the output signals/bits Y0–Y9.

Thus, as shown in FIG. 8, a count of 11 occurs in temperature segment 01 when all of the output signal/bits Y0–Y9 are active. Furthermore, a count of 12 occurs in temperature segment 01 when output signals/bits Y0–Y8 are active. Similarly, a count of 21 occurs in temperature segment 01 when all of the output signals/bits Y0–Y9 are inactive.

However, when reaching a count of 21, the output signal/bit Y0 changes state from a logic high to a logic low. When the output signal/bit Y0 changes state, the temperature segment signal/bit S0 changes state from low to high, while the temperature segment signal/bit S1 remains high. Thus, as shown in FIG. 8, this causes the temperature segment to change from 01 to 11.

This, in turn, changes the logic states of the even and odd signals EVENZ and ODDZ output by flip-flop 716. Thus, when the even and odd signals EVENZ and ODDZ change state, shift circuit 720 changes the logic state of the shift left/right signal SL that controls the shift direction of the output signals/bits Y0–Y9.

As shown in FIG. 8, a count of 22 occurs in temperature segment 11 when all of the output signal/bits Y0–Y9 are inactive. Similarly, a count of 23 occurs in temperature segment 11 when only the lowest output signal/bit Y0 is active.

However, when reaching the count of 32, the output signal/bit Y9Z changes state from a logic high to a logic low. When the output signal/bit Y9Z changes state, the temperature segment signal/bit S1 also changes state from a logic high to a logic low, while segment signal/bit S0 remains at a logic high.

This, in turn, changes the logic states of the even and odd signals EVENZ and ODDZ that are output by flip-flop 716. When the even and odd signals EVENZ and ODDZ change state, shift circuit 720 changes the logic state of the shift left/right signal SL that controls the shift direction of the output signals/bits Y0–Y9.

Thus, as shown in FIG. 8, a count of 33 occurs when all of the output signal/bits Y0–Y9 are active. Furthermore, a count of 34 occurs when output signals/bits Y0–Y8 are active. Similarly, a count of 43 occurs when all of the output signals/bits Y0–Y9 are inactive.

However, when reaching a count of 43, the output signal/bit Y0 changes state from a logic high to a logic low. When the output signal/bit Y0 changes state, the temperature segment signal/bit S0 changes state from a logic high to a logic low, so that the segment signals/bits S0–S1 are both low. This completes the cycle of states that occur when the up signal UP is continually active (UPZ=0) and the down signal DN is continually inactive (DNZ=1).

In accordance with the present invention, FIG. 9 shows an example of the operation of segmented thermometer controller 700 for the case where the down signal DN is continually active (DNZ=0) and the up signal UP is continually inactive (UPZ=1).

Comparing the graph in FIG. 9 with the graph in FIG. 8, it can be seen that there are two important differences. First of all, the temperature segment sequence in FIG. 9 is 10, 11, 01, 00, whereas the temperature segment sequence in FIG. 8 is 00,01,11,10.

Secondly, for any given temperature segment, the logic polarity of shift left/right signal SL in FIG. 9 is opposite to logic polarity of the shift left/right signal SL in FIG. 8. For example, in FIG. 9 the logic polarity of the shift left/right signal SL is high in temperature segment 00, causing a left shift operation to be performed on the output signals Y0–Y9. However, as shown in FIG. 8, the logic polarity of the shift left/right signal SL is low in temperature segment 00, causing a right shift operation to be performed on the output signals Y0–Y9.

The example shown in FIG. 8 applies to the special case where the up signal UP is continually active (UPZ=0), and the example shown in FIG. 9 applies to the special case where the down signal DN is continually active (DNZ=0). However, during normal operation, the up signal UP and the down signal DN can become active or inactive in any sequential order.

Furthermore, during normal operation, there will be cases where the up signal UP and the down signal DN are both inactive. In these cases, referring to FIGS. 7, 10 and 11, it can be seen that the gated clock signal GCLK will remain low, allowing the output signals/bits Y0–Y9 to remain unchanged.

Figure 12:
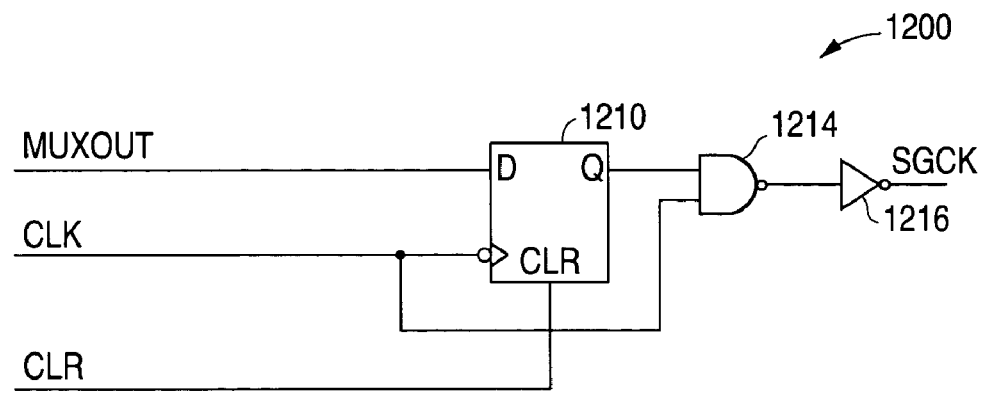
FIG. 12 is a schematic diagram illustrating an example of a clock generation circuit 1200 in accordance with the present invention.
Figure 13:
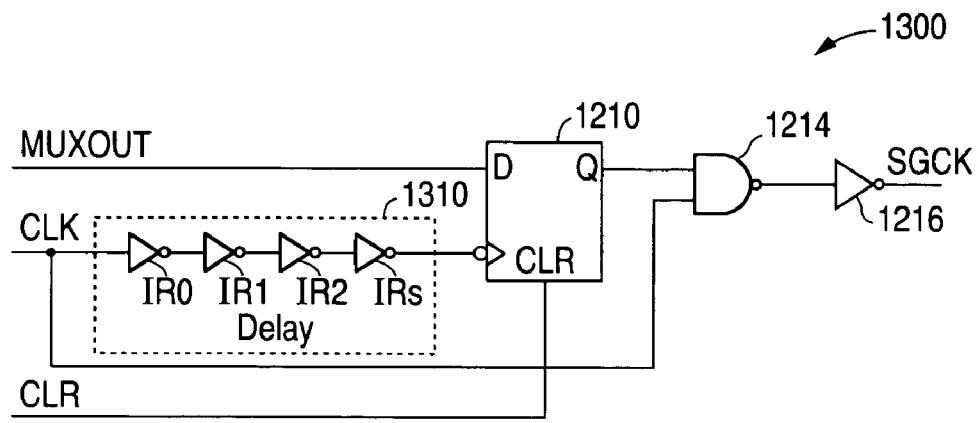
FIG. 13 is a schematic diagram illustrating an example of a clock generation circuit 1300 in accordance with the present invention.

Furthermore, referring to FIGS. 7, 12 and 13, it can be seen that the gated clock signal SGCK will also remain low, allowing the temperature segment signals/bits S0–S1 to remain unchanged.

During normal operation, the up signal UP and the down signal DN cannot be active at the same time. Therefore, cases where the up signal UP is active (UPZ=0) and the down signal DN is active (DNZ=0) are forbidden.

Figure 10:
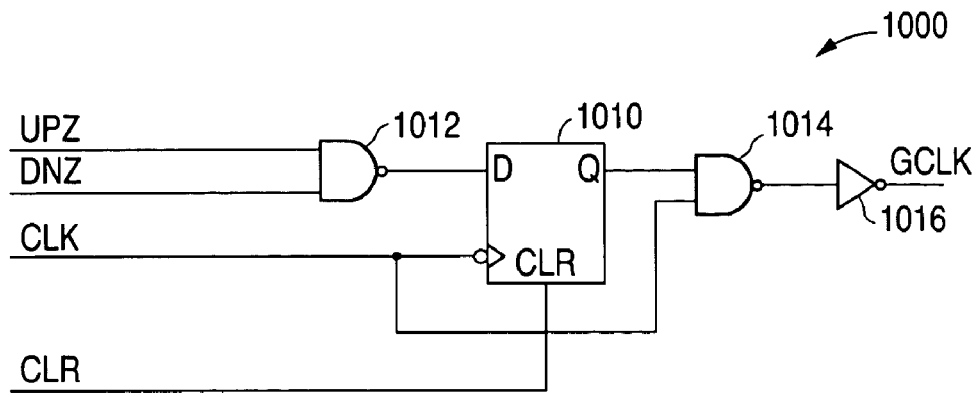
FIG. 10 is a schematic diagram illustrating an example of a clock generation circuit 1000 in accordance with the present invention.

FIG. 10 shows a schematic diagram that illustrates an example of a clock generation circuit 1000 in accordance with the present invention. Clock generation circuit 1000 can be used to implement clock generation circuit 740. As shown in FIG. 10, circuit 1000 includes a D flip-flop 1010 that is trailing-edge-triggered (active low clock), and a NAND gate 1012 that is connected to flip-flop 1010.

Flip-flop 1010 has a D input, an active low clock input, a clear input, and a Q output. NAND gate 1012, in turn, has a first input connected to receive the active low up signal UPZ, a second input connected to receive the active low down signal DNZ, and an output connected to the D input of flip-flop 1010.

As further shown in FIG. 10, circuit 1000 also includes a NAND gate 1014 that has an output, a first input connected to receive the Q output of flip-flop 1010, and a second input connected to receive the clock signal CLK. Furthermore, circuit 1000 also includes an inverter 1016 that has an input connected to the output of NAND gate 1014, and an output that generates the gated clock signal GCLK.

In operation, when the clock signal CLK falls, it forces the output of NAND gate 1014 to go high, forcing the output of inverter 1016 and the gated clock signal GCLK to go low. However, when the clock signal CLK falls, it also clocks data into the trailing-edge-triggered flip-flop 1010.

The D input of trailing-edge-triggered flip-flop 1010 is driven by NAND gate 1012, whose output goes high only if the active low up signal UPZ, or the active low down signal DNZ is active. In other words, when the clock signal CLK falls, the Q output of flip-flop 1010 will go high only if the active low up signal UPZ is active, or if the active low down signal DNZ is active (both signals being active is an illegal state).

If the Q output of flip-flop 1010 changes state when the clock signal CLK falls, the changing Q output will not affect the output of NAND gate 1014 because this output is already being forced high by the low clock signal CLK, which has just fallen. Thus, if the Q output of flip-flop 1010 changes state when the clock signal CLK falls, the changing Q output will not generate any glitches on the output of NAND gate 1014. Furthermore, since the output of NAND gate 1014 drives inverter 1016, whose output is the gated clock signal GCLK, there will not be any output glitches on the gated clock signal GCLK when the clock signal CLK falls.

When the clock signal CLK rises, this condition allows the Q output of flip-flop 1010 to drive the gated clock output signal GCLK through NAND gate 1014 and inverter 1016. Thus, if the Q output of flip-flop 1010 has previously gone high, a clock pulse will be generated on the gated clock signal GCLK output when the clock signal CLK rises. Conversely, if the Q output of flip-flop 1010 has previously gone low, a clock pulse will not be generated on the gated clock signal GCLK output when the clock signal CLK rises.

In most applications, the active low up and down signal inputs UPZ and DNZ will change state after the clock signal CLK has gone high. However, since flip-flop 1010 samples these inputs when the clock signal CLK goes low, the active low up and down signal inputs UPZ and DNZ must become valid within one half of the clock period CLK (ignoring the setup time of flip-flop 1010).

In very high speed applications, the active low up and down signals UPZ and DNZ may not have enough time to become valid when the clock signal CLK falls. Thus, in order to deal with this situation, a clock generation circuit with a delay on the active low clock input can alternately be used.

Figure 11:
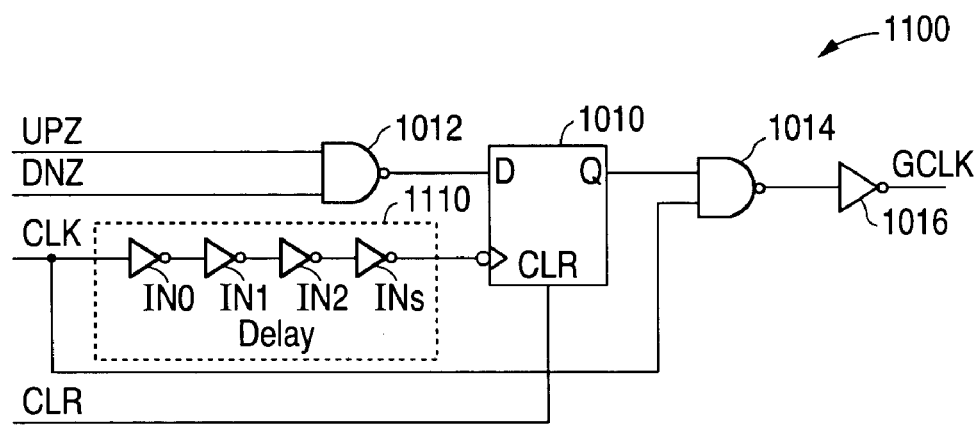
FIG. 11 is a schematic diagram illustrating an example of a clock generation circuit 1100 in accordance with the present invention.

FIG. 11 shows a schematic diagram that illustrates an example of a clock generation circuit 1100 in accordance with the present invention. Circuit 1100 is similar to circuit 1000 and, as a result, utilizes the same reference numerals to designate the structures which are common to both circuits.

As shown in FIG. 11, circuit 1100 is the same as circuit 1000 except that circuit 1100 also includes a delay 1110 that is connected to the active low clock input of flip-flop 1010. Delay 1110, in turn, includes a series of inverters IN0–INs that includes a first inverter IN0 and a last inverter INs. The first inverter IN0 receives the clock signal CLK, while the last inverter INs is connected to the active low clock input of flip-flop 1010. In addition, the second input of NAND gate 1014 is connected to the first inverter IN0 to receive the clock signal CLK.

In operation, circuit 1100 operates the same as circuit 1000, except that delay 1110 delays the arrival of the clock signal CLK at the active low clock input of flip-flop 1010. Thus the active low up and down signals UPZ and DNZ have more time to become valid after the clock signal CLK falls. This extra time is extremely important in high speed applications.

The delay provided by inverters IN0–INs depends up the PVT (process, voltage, and temperature) conditions. Thus, when the process is fast, the supply voltage is high, and the temperature is low, the delay will be very small. Conversely, when the process is slow, the supply voltage is low, and the temperature is high, the delay will be large. This delay variation is exactly what is needed because it tracks the delays provided by other logic elements on the IC chip.

FIG. 12 shows a schematic diagram that illustrates an example of a clock generation circuit 1200 in accordance with the present invention. Clock generation circuit 1200 can be used to implement clock gating circuit 752. As shown in FIG. 12, circuit 1200 includes a D flip-flop 1210 that is trailing-edge-triggered (active low clock), and a NAND gate 1214 that is connected to flip-flop 1210.

Flip-flop 1210 has a D input, an active low clock input, a clear input, and a Q output. NAND gate 1214, in turn, has an output, a first input connected to receive the Q output of flip-flop 1210, and a second input connected to receive the clock signal CLK. Furthermore, circuit 1200 also includes an inverter 1216 that has an input connected to the output of NAND gate 1214, and an output that generates the segment gated clock signal SGCK.

As shown in FIG. 12, when the clock signal CLK rises, a rising edge will be generated on the segment gated clock signal SGCK only if the mux out signal MUXOUT was high when the clock signal CLK previously fell. (Circuit 1200 is the same as circuit 1000, except that circuit 1200 lacks NAND gate 1012.)

FIG. 13 shows a schematic diagram that illustrates an example of a clock generation circuit 1300 in accordance with the present invention. Circuit 1300 is similar to circuit 1200 and, as a result, utilizes the same reference numerals to designate the structures that are common to both circuits.

As shown in FIG. 13, circuit 1300 is the same as circuit 1200 except that circuit 1300 also includes a delay 1310 that is connected to the active low clock input of flip-flop 1210. Delay 1310, in turn, includes a series of inverters IR0–IRs that includes a first inverter IR0 and a last inverter IRs. The first inverter IR0 receives the clock signal CLK, while the last inverter IRs is connected to the active low clock input of flip-flop 1210. In addition, the second input of NAND gate 1214 is also connected to the first inverter IR0, to receive the clock signal CLK.

In operation, circuit 1300 operates the same as circuit 1200 except that delay 1310 delays the arrival of the clock signal CLK at the active low clock input of flip-flop 1210. Thus the MUXOUT signal has more time to become valid after the clock signal CLK falls. This extra time is extremely important in high speed applications. Thus, for high speed applications where circuit 1200 would be too slow, circuit 1300 can be used in lieu of circuit 1200.

FIGS. 14A–14K show timing diagrams that illustrate an example of the temperature waveforms of the output signals/bits Y0–Y9 in accordance with the present invention. FIGS. 14A–14K show the output signals/bits Y0–Y9 being sequentially activated, inactivated, activated, and inactivated. As a result, the lowest output signal/bit Y0 is activated for the longest time, and therefore has the highest duty cycle temperature waveform. Similarly, the highest output signal/bit Y9 is activated for the shortest time, and therefore has the shortest duty cycle temperature waveform.

Figure 15:
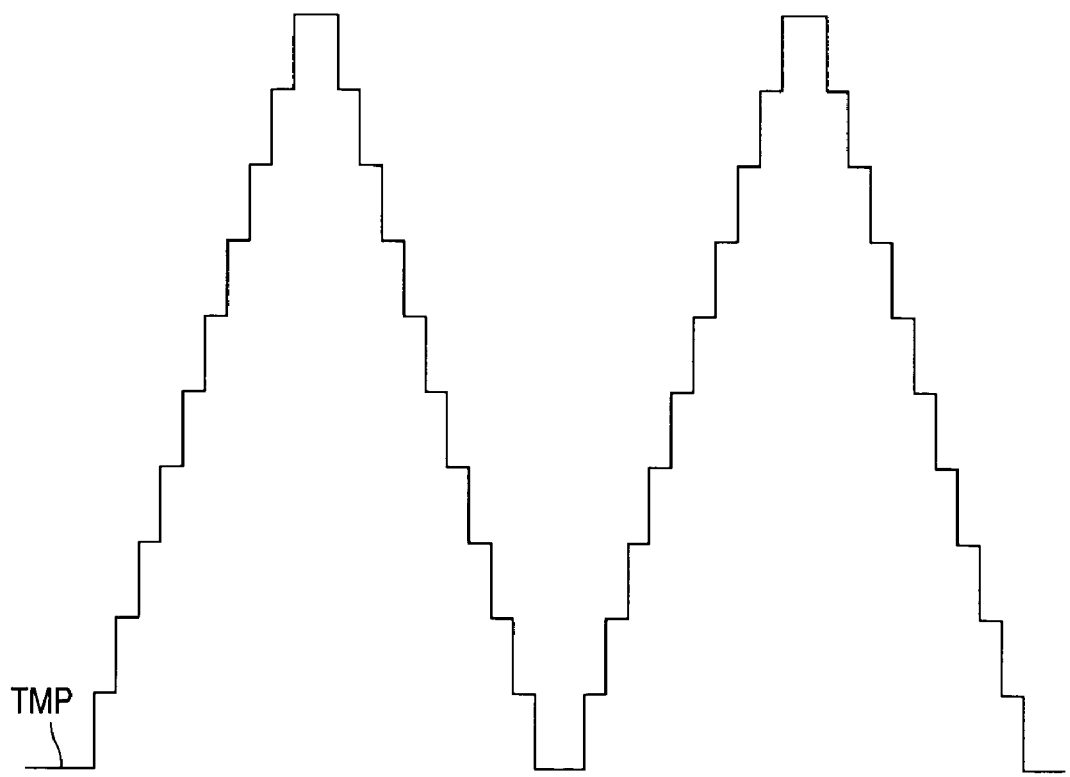
FIG. 15 is a graph illustrating an example of a single temperature waveform in accordance with the present invention.

For visual convenience, all of the temperature waveforms shown in FIGS. 14A–14K can be summed together, producing a single waveform. Thus, in accordance with the present invention, FIG. 15 shows a graph that illustrates an example of a single temperature waveform TMP. Referring to FIG. 15, the single temperature waveform TMP is an alternate representation of the waveforms shown in FIGS. 8, 9 and 14A–14K.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A thermometer controller comprising:
   a series of scan flip-flops that generate a corresponding series of output signals that represent a plurality of bits in a thermometer code, each scan flip-flop having a clock input that receives a clock signal and a Q output that generates an output signal, each scan flip-flop, except a first flip-flop and a last flip-flop in the series, having:
a first data input that receives the output signal from the Q output of a preceding scan flip-flop in the series; and
a second data input that receives the output signal from the Q output of a next scan flip-flop in the series.

2. The thermometer controller of claim 1 wherein the first data input is continuously electrically connected to the Q output of the preceding scan flip-flop in the series.

3. The thermometer controller of claim 1 wherein the second data input is continuously electrically connected to the Q output of the next scan flip-flop in the series.

4. The thermometer controller of claim 1 wherein each scan flip-flop further has a shift input that receives a flop shift left/right signal.

5. The thermometer controller of claim 1 wherein the clock signal is a gated clock signal.

6. The thermometer controller of claim 4 wherein each scan flip-flop includes:
a flip-flop stage that receives an intermediate signal, and generates an output signal with a logic state of the intermediate signal when a clock edge is detected; and
a multiplexer stage having:
a first transmission gate connected to the first data input, the first transmission gate passing a signal as the intermediate signal when the flop shift left/right signal is in a first logic state; and
a second transmission gate connected to the second data input, the second transmission gate passing a signal as the intermediate signal when the flop shift left/right signal is in a second logic state.

7. The thermometer controller of claim 4 and further comprising:
a first shift circuit that outputs the flop shift left/right signal;
a second shift circuit that outputs a segment shift left/right signal;
a first gated clock circuit that outputs the clock signal as a first gated clock signal;
a second gated clock circuit that outputs a second gated clock signal; and
an output circuit connected to the second gated clock circuit and the second shift circuit that outputs a number of segment signals.

8. The thermometer controller of claim 7 wherein the first shift circuit:
logically ANDs a first logic signal and a second logic signal to form a third logic signal;
logically ANDs a fourth logic signal and a fifth logic signal to form a sixth logic signal; and
logically ORs the third logic signal and the sixth logic signal to form the flop shift left/right signal.

9. The thermometer controller of claim 8 wherein the second shift circuit:
logically ANDs a seventh logic signal and the second logic signal to form an eighth logic signal;
logically ANDs the fifth logic signal and a ninth logic signal to form a tenth logic signal;
logically ORs the eighth logic signal and the tenth logic signal to form an eleventh logic signal; and
logically ORs the fourth logic signal and the eleventh logic signal to form the segment shift left/right signal.

10. The thermometer controller of claim 9 wherein the second gated clock circuit includes:

a clock gating circuit that receives a system clock signal and a mux out signal, and outputs the second gate clock signal; and
a switch circuit that:
logically ANDs the first logic signal and the seventh logic signal to form a twelfth logic signal;
logically ANDs the fourth logic signal and the ninth logic signal to form a thirteenth logic signal; and
logically ORs the twelfth and thirteenth logic signals to form a first mux signal.

11. The thermometer controller of claim 10 wherein the switch circuit:
logically ANDs the first logic signal and the ninth logic signal to form a fourteenth logic signal;
logically ANDs the fourth logic signal and the seventh logic signal to form a fifteenth logic signal; and
logically ORs the fourteenth and fifteenth logic signals to form a second mux signal.

12. The thermometer controller of claim 11 wherein the switch circuit passes the first mux signal or the second mux signal as the mux out signal in response to a control signal.

13. The thermometer controller of claim 12 wherein the output circuit includes:
a series of scan segment flops that generate a corresponding series of segment signals, each scan segment flop having a clock input that receives the second gated clock signal and a Q output that generates a segment signal;
a logic circuit connected to receive the segment signals, and output a direction signal; and
a segment flop that outputs the control signal in response to the direction signal and the second gated clock signal.

14. The thermometer controller of claim 7 wherein the first gated clock circuit includes:
a clock flip-flop having a D input, an active low clock input, a clear input, and a Q output;
a first NAND gate having a first input, a second input, and an output connected to the D input of the clock flip-flop; and
a second NAND gate having a first input connected to the Q output of the clock flip-flop, a second input connected to the active low clock input, and an output.

15. The thermometer controller of claim 14 wherein the first gated clock circuit further includes a delay stage having an input connected to receive a system clock signal and an output connected to the active low clock input.

16. The thermometer controller of claim 15 wherein the second input of the second NAND gate is connected to the input of the delay stage.

17. The thermometer controller of claim 14 wherein the second gated clock circuit includes:
a clocked flip-flop having a D input, an active low clock input, a clear input, and a Q output; and
a third NAND gate having a first input connected to the Q output of the clocked flip-flop, a second input connected to the active low clock input of the clocked flip-flop, and an output.

18. The thermometer controller of claim 17 wherein the second gated clock circuit further includes a delay stage having an input connected to receive the system clock signal and an output connected to the active low clock input of the clocked flip-flop.

19. The thermometer controller of claim 18 wherein the second input of the third NAND gate is connected to the input of the delay stage that is connected to the active low clock input of the clocked flip-flop.

20. A thermometer controller comprising:

a series of flip-flop circuits that generate a corresponding series of output signals that represent a plurality of bits in a thermometer code, each flip-flop circuit having:
- a 2:1 multiplexer stage having a first data input to receive a first data signal, a second data input to receive a second data signal, and a selection input to receive a selection signal, and a data output to generate an intermediate signal that represents the first data signal when the selection signal has a first logic state and the second data signal when the selection signal has a second logic state; and
- a flip-flop stage that receives the intermediate signal, and generates an output signal with a logic state of the intermediate signal when an edge of a clocking signal is detected, each flip-flop circuit, except a first flip-flop circuit and a last flip-flop circuit in the series, having:
- the first data input connected to the data output of a preceding flip-flop circuit in the series; and
- the second data input connected to the data output of a succeeding flip-flop circuit in the series.

21. The thermometer controller of claim 20 and further comprising a gated clock circuit to receive a periodic clock signal a nd a control signal, and output the edge of the clocking signal in response to an edge of the periodic clock signal following a change in state of the control signal from an inactive state to an active state.

22. The thermometer controller of claim 20 wherein the preceding flip-flop circuit is an immediately preceding flip-flop circuit, and the succeeding flip-flop circuit is an immediately succeeding flip-flop circuit.

* * * * *

UNITED STATES PATENT AND TRADEMARK OFFICE
CERTIFICATE OF CORRECTION

| | | |
|---|---|---|
| PATENT NO. | : 7,109,747 B1 | Page 1 of 1 |
| APPLICATION NO. | : 10/938991 | |
| DATED | : September 19, 2006 | |
| INVENTOR(S) | : Pasqualini | |

It is certified that error appears in the above-identified patent and that said Letters Patent is hereby corrected as shown below:

Column 3,
Line 58, delete "CT1-Crn" and replace with --CT1-CTn--.

Column 4,
Line 17, delete "M0÷Mn-1" and replace with --M0-Mn- 1--.

Signed and Sealed this

Twelfth Day of December, 2006

JON W. DUDAS
*Director of the United States Patent and Trademark Office*